United States Patent [19]

Van Tilburg

[11] Patent Number: 5,029,696
[45] Date of Patent: Jul. 9, 1991

[54] GUIDING DEVICE FOR OBJECTS SUCH AS PRINTED CIRCUIT BOARDS

[75] Inventor: Hermanus B. R. Van Tilburg, Oosterhout, Netherlands

[73] Assignee: Soltec B.V., Oosterhout, Netherlands

[21] Appl. No.: 510,825

[22] Filed: Apr. 18, 1990

[30] Foreign Application Priority Data

Apr. 21, 1989 [NL] Netherlands ................. 8901014

[51] Int. Cl.⁵ ............................................. B65G 15/14
[52] U.S. Cl. ................................. 198/626.1; 198/626.6
[58] Field of Search ............... 198/626.1, 626.5, 626.6, 198/817

[56] References Cited

U.S. PATENT DOCUMENTS

| 3,179,237 | 4/1965 | Ninneman | 198/626.6 X |
| 3,286,817 | 11/1966 | Brigham | 198/626.5 |
| 3,454,142 | 7/1969 | Holstein | 198/626.1 |
| 3,848,864 | 11/1974 | Dwyer et al. | 198/817 X |
| 4,570,785 | 2/1986 | Lewanski et al. | 198/626.6 |
| 4,629,063 | 12/1986 | Hodlewsky et al. | 198/626.6 X |
| 4,705,159 | 11/1987 | Feliks et al. | 198/817 X |
| 4,874,081 | 10/1989 | Kondo | 198/817 X |

FOREIGN PATENT DOCUMENTS

| 2806593 | 8/1979 | Fed. Rep. of Germany | 198/626.1 |
| 2301307 | 9/1976 | France . | |
| 8600324 | 9/1987 | Netherlands . | |
| 2211810 | 12/1989 | United Kingdom | 198/626.1 |

OTHER PUBLICATIONS

Brandt et al, "Flexible Wire Turnover Conveyor", Western Electric, Technical Digest No. 26, Apr. 1972, pp. 11 and 12.

Primary Examiner—D. Glenn Dayoan
Attorney, Agent, or Firm—Wegner, Cantor, Mueller & Player

[57] ABSTRACT

A device for guiding objects such as printed circuit boards has a cooperating pair of spaced apart endless chain conveyors with leaf-like spring members connected to the links of each conveyor by holders such that free ends of leaf-like spring members of opposed conveyors are adapted to engage opposite edges of the object in order to grip the object for transporting by the conveyors. The end of each leaf-like spring member which is attached to a conveyor is provided with a reaction arm portion, angularly disposed relative to the free end thereof at a transition portion, and each holder has a recessed portion into which a reaction arm is form fitted and engaged by a retaining member so that the leaf-like spring member is tiltable about a front edge of the recessed portion of the holder generally at the transition portion of the leaf-like spring member.

6 Claims, 2 Drawing Sheets

GUIDING DEVICE FOR OBJECTS SUCH AS PRINTED CIRCUIT BOARDS

BACKGROUND AND SUMMARY OF THE INVENTION

The invention relates to a device for guiding objects such as printed circuit boards, said device comprising a frame, two endless chain conveyors the reversing axes whereof stand vertically and the active parts whereof are arranged facing towards and at an interval from each other, and leaf-like spring members connected to the links of the conveyor, the free bottom end of these members being adapted to grip the side edge of said object.

Such guiding devices of the type described in the preamble are generally used with soldering machines for soldering components on the boards. These boards have a determined width to which the interval between the active parts of the conveyor belts are adjusted, which width can however vary within determined margins. For this purpose the leaf springs are necessary to accommodate these differences in tolerance, wherein account also has to be taken of heat expansion and the like as this occurs in the case of soldering machines wherein the objects are guided over a heat-radiating pre-drying zone and a solder bath.

The invention has for its object to improve the guiding device, and in particular the construction of the leaf spring members, such that the above stated requirements are fulfilled and the construction, particularly the interchangeability thereof, is improved, the number of components is reduced and the cost price is therefore lower.

The device according to the invention is distinguished in that the end of the leaf spring remote from said free end is extended with a reaction arm part, and said leaf spring is supported tiltably close to the transition between reaction arm and leaf spring on a holder connected to the chain, wherein means are present for pressing the reaction arm part resiliently against the holder, so fitting of said spring member can be considerably simplified since said reaction arm can be made such that form-fitting mounting on the holder is possible.

In one embodiment the holder is provided in the upper surface with a recessed portion wherein the reaction arm part is arranged close-fittingly.

According to a further development the press-on member is embodied as a resilient strip fixed onto the holder and extending above the recessed portion.

Through the use of this resilient strip the flexibility of the leaf spring member relative to the holder is considerably enlarged. The selection of the desired materials, temperature resistance, spring action and shape can moreover be adapted to the various functions, whereby an optimally operating spring system results.

In order to use the resilient strip also as fixing means for the leaf spring member, the resilient strip has to extend according to the invention over at least three wall surfaces of the holder.

Above mentioned and other features will be further elucidated in the figure description following below of an embodiment.

DETAILED DESCRIPTION OF THE INVENTION

Figure 1:
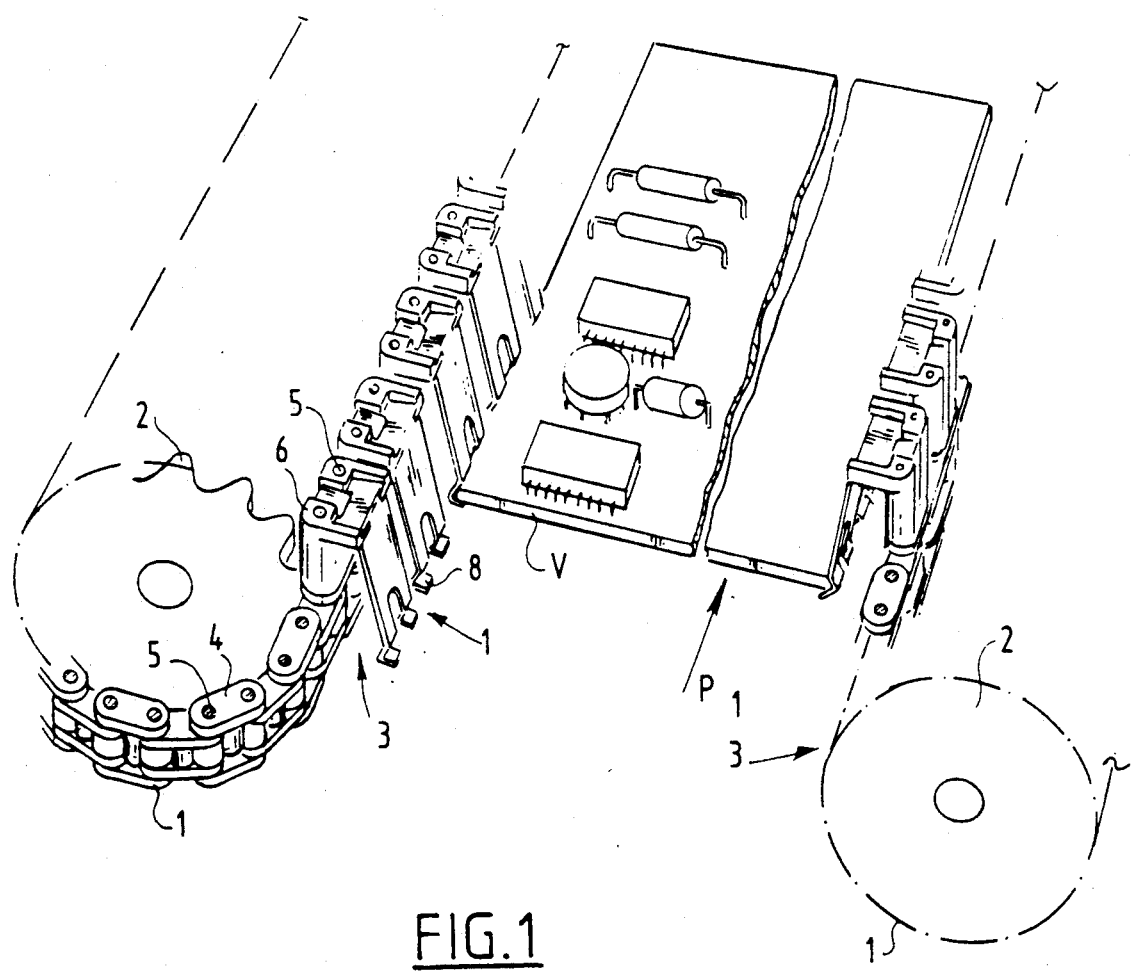
FIG. 1 shows a perspective top view of a guiding device for objects according to the invention.

The guiding device according to the invention shown in FIG. 1 consists of two endless conveyor elements 1, here in the form of a link chain which is trained about a gear wheel 2 and wherein the other gear wheel, which is not shown, lies at a determined interval.

The reversing wheels for the chain 1 are placed such that the active parts 3 of each endless chain element lie parallel to and at an interval from each other. In the embodiment shown each link 4 of the chain has lengthened hinge pins 5 such that these extend far above the surface of the gear wheel 2. It is also conceivable that the pins 5 extend on the underside of the chain. Arranged on these lengthened hinge pins 5 are holders 6 which are disposed in a guide rail (not shown) and which serve for mounting of leaf-form spring members 7, the bottom portion 8 of which takes a fork-shaped form, wherein each tooth of the fork is bent into a V-shape in order to be suitable for grasping the side edge of an object V, for instance a printed circuit board, onto which must be soldered elements for an electronic circuit. Transporting of the printed circuit board takes place in the direction of the arrow P1 and it can be carried for example past different stations, which are not shown, but which may for instance be a soldering station. It is known that quite great temperature differences have to be withstood in such soldering devices, so that the chain 1 having leaf spring members 7 arranged thereon or thereunder have to be able to withstand these temperature differences.

Figure 2:
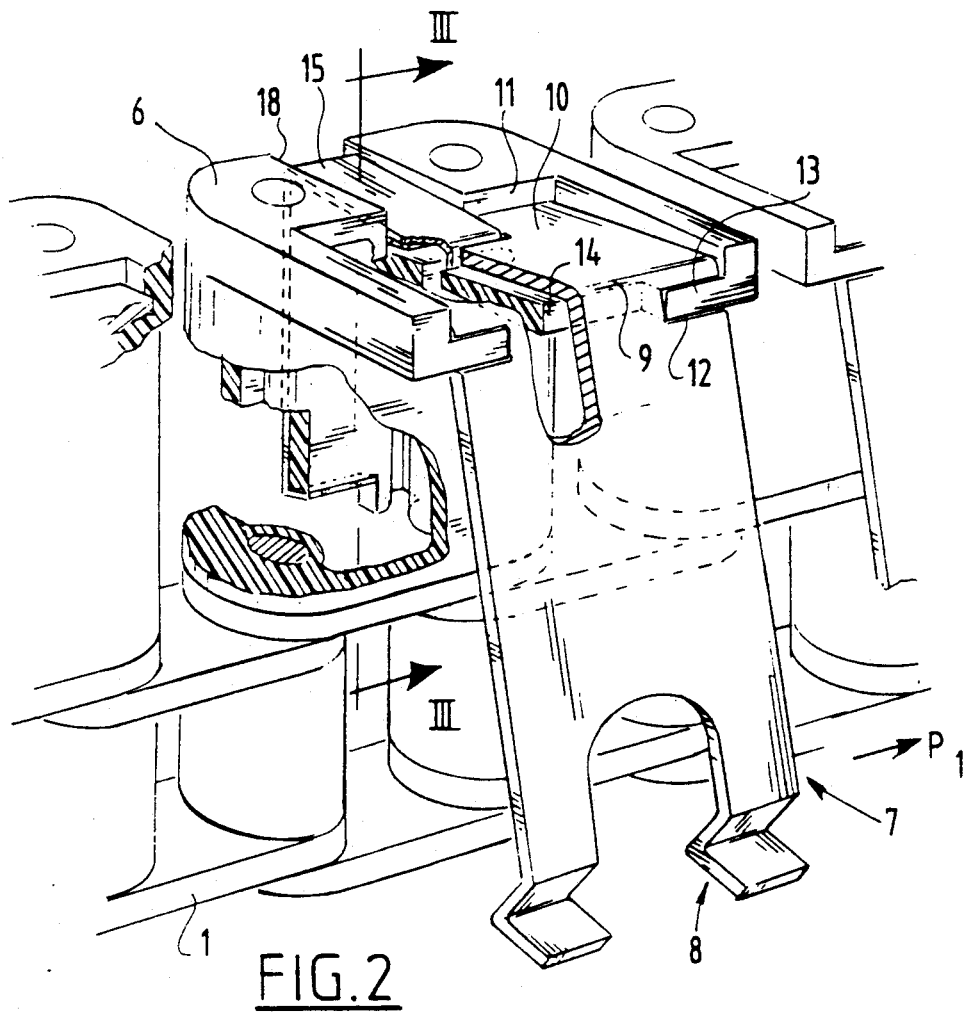
FIG. 2 is a perspective view of a detail of the guiding device provided with a leaf spring member according to the invention on an enlarged scale.
Figure 3:
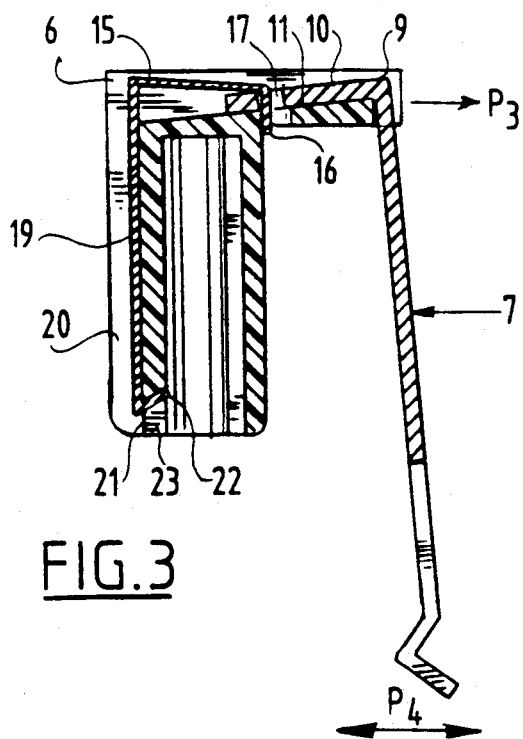
FIG. 3 shows a section along the line III—III in FIG. 2.

There now follows a description of the leaf spring members according to the invention with reference to FIGS. 2 and 3.

According to the invention the leaf-form spring member 7 is lengthened on the side 9 remote from the free end 8 with a reaction arm part 10. In the embodiment shown this reaction arm part 10 encloses a determined angle, for example 90°, with the leaf spring member 7. The reaction arm part 10 has a determined width and a determined length and fits precisely in form-fitting manner into a cut-away part 11 in the form of a recessed portion in the upper surface of the holder 6. The upper surface of the recessed portion 11 runs sloping to the vertical but it will be apparent that this can have any other position that is suitable for the desired operation of the leaf spring member 7.

The leaf spring member has a partial incision at 12, which incision falls around the edge portion 13 of the recess 11 of the holder 6, which becomes possible as a result of an incision 14 likewise arranged in that edge portion 13, this incision or cut-away portion lying in the centre of the recessed portion 11. The depth of the cut-away portion 14 is at least equal to the thickness of the leaf spring member 7.

With the embodiment shown it will be apparent that the reaction arm part 10 is received form-fittingly into the recess 11 of the holder 6, that is, it no longer shifts in the conveying direction P1 relative to the holder 6 and is locked in upward and downward sense by the cut-away portion 12 and the upper surface of the recess 11.

In order to prevent the possibility of the leaf spring 7 shifting out of the recess 11 in the direction of the arrow P3, see FIG. 3, a fixing member, here taking the form of a leaf spring strip 15 that has a substantially U-shaped form, serves to fix the leaf spring member 7 on the holder 6. The short leg 16 of the leaf spring strip falls into an opening 17 in the reaction arm part 10 of the leaf spring member 7, the body portion of the leaf spring strip falls into a narrow recess 18 of the holder 6 communicating with the recess 11, while the long leg 19 of the leaf spring strip extends along the rear wall of the holder 6 in a recess 20 conforming with the recess 18. The long leg 19 is provided at 21 with a lip 22 which falls into a cut-away portion 23 of the holder 6.

It will be apparent from the above that the fitting of the leaf-form spring member 7 is restricted to the placing of the reaction arm part 10 in the recess 11, arranging the short leg 16 in the opening 17 of the reaction arm part 10 and subsequently snapping the lip 22 fixedly into the opening 23 of holder 6. With the leaf spring strip 15 shown it is possible for the leaf spring 7 to have every freedom of movement in the direction of arrow P4 so that the device is fully adapted to grasp hold of the object V along the side edge, which can take place within determined tolerances, wherein possible changes of dimension as a consequence of temperature changes can be accommodated without hindrance.

The invention is not limited to the above described embodiment, wherein a particular matter for consideration is the form of the leaf spring strip 15, which can extend above the recess 11 in a manner other than shown. Conceivable here is a leaf spring spanning the side edges adjacent to the recess 11 for pressing down the reaction arm part 10 into the recess 11.

I claim:

1. In a device for handling objects such as printed circuit boards and having leaf spring members, each said leaf spring member having one end connected to a corresponding conveyor of a pair of conveyors and another end protruding freely from said conveyor and engageable with an edge of said object, said conveyors being spaced apart sufficiently that said object is graspable at opposite edges between at least two of said leaf spring members, each of which are connected to a different one of said pair of conveyors, and transportable by said pair of conveyors, the improvement comprising:

said one end of said leaf spring member comprising a reaction arm angularly disposed relative to said protruding other end at a transition portion of said leaf spring member; and means for holding said reaction arm and providing connection of said leaf spring member to said conveyor, said holding means comprising a recessed portion into which said reaction arm is generally conformable in order that movement of said leaf spring member in said transporting direction is prevented, and further comprising an edge of said holding means situated generally parallel to a direction of transporting said object by said conveyor and at which said transition portion of said reaction arm is situateable generally in order that said leaf spring member is supported tiltably on said holding means edge, and further comprising a means for retaining said reaction arm resiliently in said recessed portion.

2. The improvement as in claim 1, said retaining means comprising:

at least one resilient strip attached to said holding means and extending into engagement with said reaction arm.

3. The improvement as in claim 2, wherein said retaining means comprises:

means for extending about at least three wall surfaces of said holding means.

4. The improvement as in claim 1, and further comprising:

a portion of said holding means edge which is common to said recessed portion being cut away to provide cut-away and plane portions of said holding means edge; and said leaf spring member being notched to provide a notched portion and a reduced width portion situated generally at said transition portion, said notched portion being adapted to receive a plane portion of said holding means in order to restrict movement of said leaf spring member relative to said conveyor in directions generally perpendicular to said transporting direction.

5. The improvement as in claim 4, wherein said reduced width portion of said leaf spring member is receivable in said cut-away portion of said holding means.

6. The improvement as in claim 2, and further comprising:

an aperture provided in said reaction arm of said leaf spring member; and a leg portion of said retaining means being engageable in said reaction arm aperture in order to limit movement of said reaction arm generally along a bottom surface of said recessed portion of said holding means.

* * * * *